United States Patent
Anzue et al.

(10) Patent No.: US 8,647,907 B2
(45) Date of Patent: Feb. 11, 2014

(54) NITRIDE-BASED SEMICONDUCTOR DEVICE AND METHOD FOR FABRICATING THE SAME

(71) Applicant: Panasonic Corporation, Osaka (JP)

(72) Inventors: Naomi Anzue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/654,955

(22) Filed: Oct. 18, 2012

(65) Prior Publication Data

US 2013/0040411 A1 Feb. 14, 2013

Related U.S. Application Data

(63) Continuation of application No. PCT/JP2011/002509, filed on Apr. 28, 2011.

(30) Foreign Application Priority Data

Apr. 28, 2010 (JP) ................................. 2010-104363

(51) Int. Cl.
*H01L 21/00* (2006.01)

(52) U.S. Cl.
USPC ........ 438/47; 438/22; 438/516; 257/E33.027; 257/E21.158

(58) Field of Classification Search
USPC .............. 438/22–47, 516; 257/76–80, 94–98, 257/615, E21.158, E33.027
See application file for complete search history.

(56) References Cited

U.S. PATENT DOCUMENTS

| 6,388,696 B1 * | 5/2002 | Taninaka et al. ............. 347/238 |
| 2004/0026702 A1 | 2/2004 | Yamada et al. |
| 2004/0058465 A1 * | 3/2004 | Taki .............................. 438/22 |

(Continued)

FOREIGN PATENT DOCUMENTS

| JP | 2005-197631 A | 7/2005 |
| JP | 3916726 B | 2/2007 |

(Continued)

OTHER PUBLICATIONS

International Search Report for corresponding International Application No. PCT/JP2011/002509 mailed Jul. 26, 2011.

(Continued)

*Primary Examiner* — Charles Garber
*Assistant Examiner* — Abdulfattah Mustapha
(74) *Attorney, Agent, or Firm* — Renner, Otto, Boisselle & Sklar, LLP

(57) ABSTRACT

A method includes the step of preparing a GaN-based substrate 10, the step of forming on the substrate a nitride-based semiconductor multilayer structure including a p-type $Al_dGa_eN$ layer (p-type semiconductor region) 26, the p-type $Al_dGa_eN$ layer 26 being made of an $Al_xIn_yGa_zN$ semiconductor (x+y+z=1, x≥0, y≥0, z≥0), and a principal surface of the p-type $Al_dGa_eN$ layer 26 being an m-plane, the step of forming a metal layer 28 which contains at least one of Mg and Zn on the principal surface of the p-type $Al_dGa_eN$ layer 26 and performing a heat treatment, the step of removing the metal layer 28, and the step of forming a p-type electrode on the principal surface of the p-type $Al_dGa_eN$ layer 26, wherein the heat treatment causes a N concentration to be higher than a Ga concentration in the p-type $Al_dGa_eN$ layer 26.

8 Claims, 11 Drawing Sheets

(56) References Cited

U.S. PATENT DOCUMENTS

| | | |
|---|---|---|
| 2005/0142820 A1* | 6/2005 | Kim .................. 438/516 |
| 2008/0001165 A1* | 1/2008 | Hashimoto et al. .......... 257/103 |
| 2008/0048195 A1 | 2/2008 | Okuyama et al. |
| 2009/0134418 A1 | 5/2009 | Lee |
| 2011/0037088 A1 | 2/2011 | Oya et al. |
| 2011/0037089 A1 | 2/2011 | Oya et al. |
| 2011/0156048 A1 | 6/2011 | Yokogawa et al. |
| 2011/0266575 A1 | 11/2011 | Anzue et al. |

FOREIGN PATENT DOCUMENTS

| | | |
|---|---|---|
| JP | 2008-147587 A | 6/2008 |
| JP | 2008-153285 A | 7/2008 |
| JP | 2009-534830 T | 9/2009 |
| JP | 2009-238834 A | 10/2009 |
| WO | 03/007390 A1 | 1/2003 |
| WO | 2010/052810 A1 | 5/2010 |
| WO | 2010/113405 A1 | 10/2010 |
| WO | 2010/113406 A1 | 10/2010 |
| WO | 2011/086620 A1 | 7/2011 |

OTHER PUBLICATIONS

Form PCT/IPEA/409 for corresponding International Application No. PCT/JP2011/002509 mailed Jul. 24, 2012.

Liday et al., "Investigation of $NiO_x$-based contacts on p-GaN", J. Master Sci Master Electron, Aug. 2008, vol. 19, No. 8/9, pp. 855-862.

Youn et al., "Comparison and Investigation of Ohmic Characteristics in the Ni/AuZn and Cr/AuZn Metal Schemes", Jpn. J. Appl. Phys. 37 (1998) pp. 4667-4671.

\* cited by examiner

NITRIDE-BASED SEMICONDUCTOR DEVICE AND METHOD FOR FABRICATING THE SAME

This is a continuation of International Application No. PCT/JP2011/002509, with an international filing date of Apr. 28, 2011, which claims priority of Japanese Patent Application No. 2010-104363, filed on Apr. 28, 2010, the contents of which are hereby incorporated by reference.

BACKGROUND

1. Technical Field

The present application relates to a nitride semiconductor device and a method for fabricating such a device. More particularly, the present application relates to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is expected to be applied to various fields of technologies including display, illumination and optical information processing in the near future. The present application also relates to a method of making an electrode for use in such a nitride-based semiconductor device.

2. Description of the Related Art

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $x+y+z=1$, $x\geq0$, $y\geq0$, $z\geq0$)) have been researched and developed particularly extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a single cell of GaN. In an $Al_xGa_yIn_zN$ (where $x+y+z=1$, $x\geq0$, $y\geq0$, $z\geq0$) semiconductor crystal, some of the Ga atoms shown in FIG. 1 may be replaced with Al and/or In atoms.

FIG. 2 shows four vectors $a_1$, $a_2$, $a_3$ and c, which are generally used to represent planes of a wurtzite crystal structure with four characters (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a substrate of which the principal surface is a c-plane, i.e., a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated toward the InGaN quantum well in the active layer in the c-axis direction. Once such a piezoelectric field has been generated in the generation layer, some positional deviation occurs in the distributions of electrons and holes in the active layer due to the quantum confinement Stark effect of carriers. Consequently, the internal quantum yield decreases. Thus, in the case of a semiconductor laser diode, the threshold current increases. In the case of an LED, the power dissipation increases, and the luminous efficacy decreases. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" be used. As used herein, "-" attached on the left-hand side of a Miller-Bravais index in the parentheses means a "bar" (a negative direction index). As shown in FIG. 2, the m-plane is parallel to the c-axis (primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

The "m-plane" is a generic term that collectively refers to a family of planes including (10-10), (-1010), (1-100), (-1100), (01-10) and (0-110) planes. As used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

SUMMARY

The prior art technique needs further improvement to realize a GaN-based semiconductor light-emitting device having better lighting characteristics.

One non-limiting, and exemplary embodiment provides a method for producing GaN-based semiconductor light-emitting device having better lighting characteristics.

In one general aspect, a nitride-based semiconductor light-emitting device fabrication method disclosed herein includes the steps of: (a) preparing a substrate; (b) forming on the substrate a nitride-based semiconductor multilayer structure including a p-type semiconductor region, the p-type semiconductor region being made of an $Al_xIn_yGa_zN$ semiconductor ($x+y+z=1$, $x\geq0$, $y\geq0$, $z\geq0$), and a principal surface of the p-type semiconductor region being an m-plane; (c) forming a metal layer which contains at least one of Mg and Zn on the principal surface of the p-type semiconductor region and performing a heat treatment; (d) removing the metal layer; and (e) forming a p-type electrode on the principal surface of the p-type semiconductor region, wherein the heat treatment of step (c) causes a N concentration in the p-type semiconductor region to be higher than a Ga concentration in the p-type semiconductor region.

In another general aspect, a nitride-based semiconductor light-emitting device disclosed herein includes: a nitride-based semiconductor multilayer structure including a p-type semiconductor region, a principal surface of the p-type semiconductor region being an m-plane; and an electrode which is arranged on the p-type semiconductor region, wherein the p-type semiconductor region is made of an $Al_xIn_yGa_zN$ semiconductor ($x+y+z=1$, $x\geq0$, $y\geq0$, $z\geq0$), and a N concentration in the p-type semiconductor region is higher than a Ga concentration in the p-type semiconductor region.

According to the above aspects, Ga vacancies formed in a p-type semiconductor layer serve as carriers, so that the resistance of the p-type semiconductor layer can be reduced, thereby providing a GaN-based semiconductor light-emitting device having better lighting characteristics.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1:
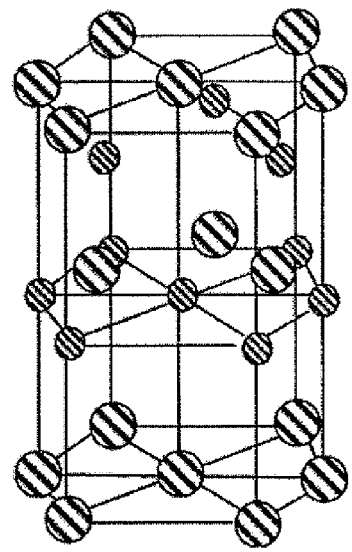
FIG. 1 is a perspective view schematically illustrating a unit cell of GaN.
Figure 1:
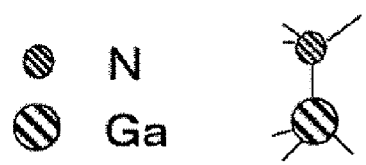
Figure 2:
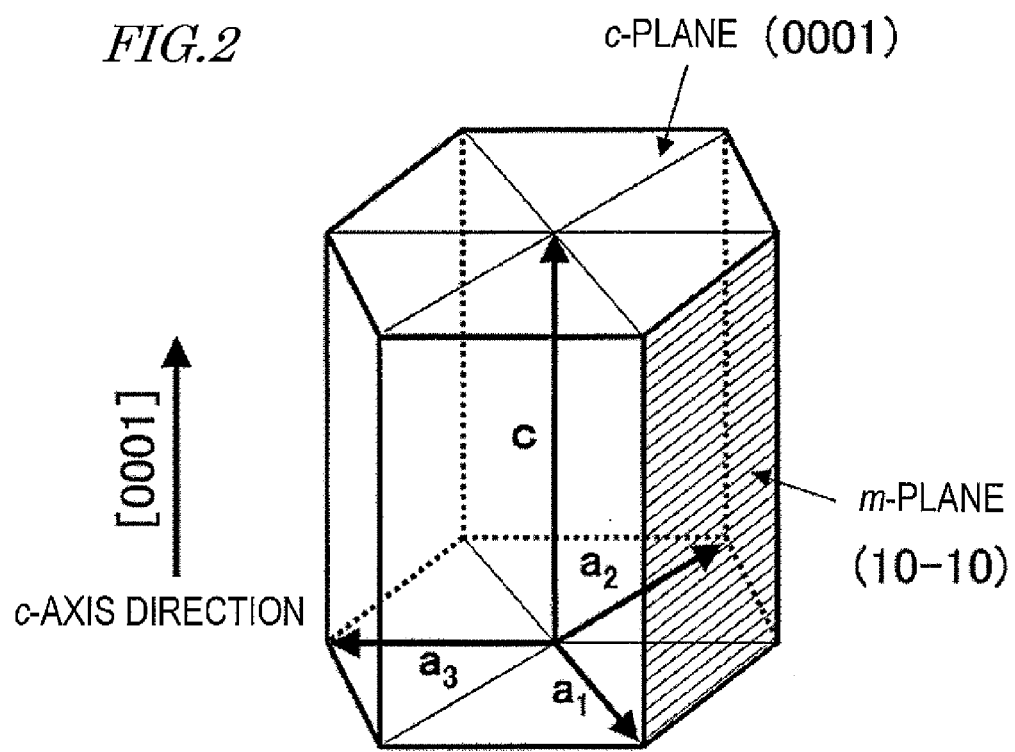
FIG. 2 is a perspective view showing primitive translation vectors $a_1$, $a_2$ and $a_3$ representing a wurtzite crystal structure.

A GaN-based semiconductor device that has been grown on an m-plane substrate would achieve far more beneficial effects than what has been grown on a c-plane substrate. However, the inventors of the present application have found that such a GaN-based semiconductor device that has been grown on an m-plane substrate still has the following drawback. Specifically, a GaN-based semiconductor device that has been grown on an m-plane substrate has higher contact resistance than what has been grown on a c-plane substrate, which constitutes a serious technical obstacle to using such a GaN-based semiconductor device that has been grown on an m-plane substrate.

Under the circumstances such as these, the present inventors wholeheartedly carried out extensive research to overcome such a problem with the prior art that a GaN-based semiconductor device, grown on an m-plane as a non-polar plane, would have high contact resistance. As a result, we found a means which is capable of reducing the contact resistance. One of embodiments of the present invention is as follows.

A nitride-based semiconductor light-emitting device fabrication method according to one embodiment of the present invention includes the steps of: (a) preparing a substrate; (b) forming on the substrate a nitride-based semiconductor multilayer structure including a p-type semiconductor region, the p-type semiconductor region being made of an $Al_xIn_yGa_zN$ semiconductor ($x+y+z=1$, $x \geq 0$, $y \geq 0$, $z \geq 0$), and a principal surface of the p-type semiconductor region being an m-plane; (c) forming a metal layer which contains at least one of Mg and Zn on the principal surface of the p-type semiconductor region and performing a heat treatment; (d) removing the metal layer; and (e) forming a p-type electrode on the principal surface of the p-type semiconductor region, wherein the heat treatment of step (c) causes a N concentration in the p-type semiconductor region to be higher than a Ga concentration in the p-type semiconductor region.

The heat treatment of step (c) may cause a Ga vacancy concentration in the p-type semiconductor region to be higher than a N vacancy concentration in the p-type semiconductor region.

The heat treatment of step (c) may scarcely cause diffusion of Mg or Zn from the metal layer to the p-type semiconductor region.

The p-type electrode may contain Ag or an Ag alloy.

Step (e) may include heating the metal layer at a temperature of not less than 400° C. and not more than 600° C.

Step (c) may include forming the metal layer which includes a Mg layer, and the Mg layer may be formed by applying an electron beam in pulses to Mg such that Mg is evaporated and deposited on the p-type semiconductor region.

When the metal layer is a Mg layer, the heat treatment in step (c) may be performed at a temperature of not less than 550° C. and not more than 800° C., and when the metal layer is a Zn layer or an alloy layer of Mg and Zn, the heat treatment in step (c) may be performed at a temperature of not less than 400° C. and not more than 700° C.

The heat treatment in step (c) may be performed in an inert gas atmosphere.

The method may further include the step of removing the substrate after step (b).

A nitride-based semiconductor light-emitting device of according to another embodiment of the present invention includes: a nitride-based semiconductor multilayer structure including a p-type semiconductor region, a principal surface of the p-type semiconductor region being an m-plane; and an electrode which is arranged on the p-type semiconductor region, wherein the p-type semiconductor region is made of an $Al_xIn_yGa_zN$ semiconductor (x+y+z=1, x≥0, y≥0, z≥0), and a N concentration in the p-type semiconductor region is higher than a Ga concentration in the p-type semiconductor region.

A Ga vacancy concentration in the p-type semiconductor region may be higher than a N vacancy concentration in the p-type semiconductor region.

The electrode may contain Ag or an Ag alloy.

First Embodiment

Hereinafter, the first embodiment of a nitride-based semiconductor light-emitting device of the present invention will be described with reference to the drawings. In the drawings, any elements shown in multiple drawings and having substantially the same function will be identified by the same reference numeral for the sake of simplicity. It should be noted, however, that the present invention is not limited to the embodiment that will be described below.

Figure 3A:
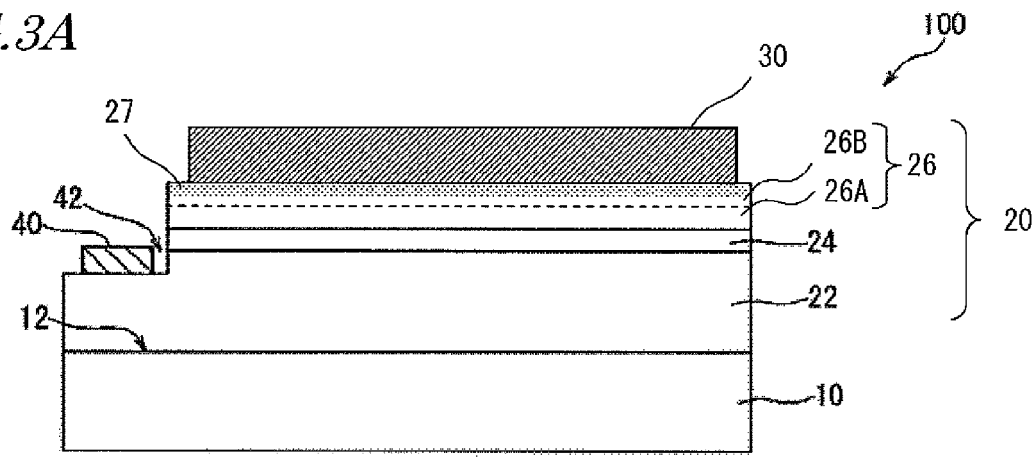
FIG. 3A is a schematic cross-sectional view illustrating a nitride-based semiconductor light-emitting device 100 of the first embodiment.

FIG. 3A is a cross-sectional view schematically showing a nitride-based semiconductor light-emitting device 100 of the first embodiment. The nitride-based semiconductor light-emitting device 100 shown in FIG. 3A is a semiconductor device which is made of GaN semiconductors and which has a nitride-based semiconductor multilayer structure.

The nitride-based semiconductor light-emitting device 100 of this embodiment includes a GaN-based substrate 10, of which the principal surface (growing plane) 12 is an m-plane, a semiconductor multilayer structure 20 that has been formed on the GaN-based substrate 10, and an electrode 30 arranged on the semiconductor multilayer structure 20. In this embodiment, the semiconductor multilayer structure 20 is an m-plane semiconductor multilayer structure that has been formed through an m-plane crystal growth and its principal surface is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20, at least the surface of its semiconductor region that is in contact with an electrode needs to be an m-plane.

The nitride-based semiconductor light-emitting device 100 of this embodiment includes the GaN-based substrate to support the semiconductor multilayer structure 20. However, the device 100 may have any other substrate instead of the GaN-based substrate 10 and could also be used without the substrate.

Figure 3B:
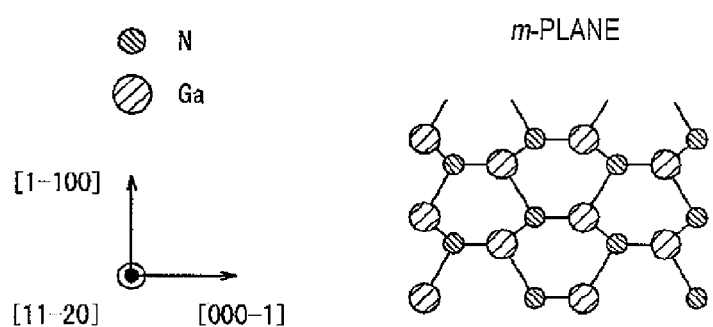
FIG. 3B illustrates the crystal structure of an m-plane.

FIG. 3B schematically illustrates the crystal structure of a nitride-based semiconductor, of which the principal surface is an m-plane, as viewed on a cross section thereof that intersects with the principal surface of the substrate at right angles. Since Ga atoms and nitrogen atoms are present on the same atomic-plane that is parallel to the m-plane, no electrical polarization will be produced perpendicularly to the m-plane. That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as an "m-plane GaN-based substrate". To obtain an m-plane nitride-based semiconductor multilayer structure that has grown perpendicularly to the m-plane, typically such an m-plane GaN-based substrate may be used and semiconductors may be grown on the m-plane of that substrate. This is because the crystallographic-plane orientation of the semiconductor multilayer structure should be identical with that of the principal surface of the GaN-based substrate. However, the principal surface of the substrate does not always have to be an m-plane as described above, and the device as a final product could already have its substrate removed.

Figure 3C:
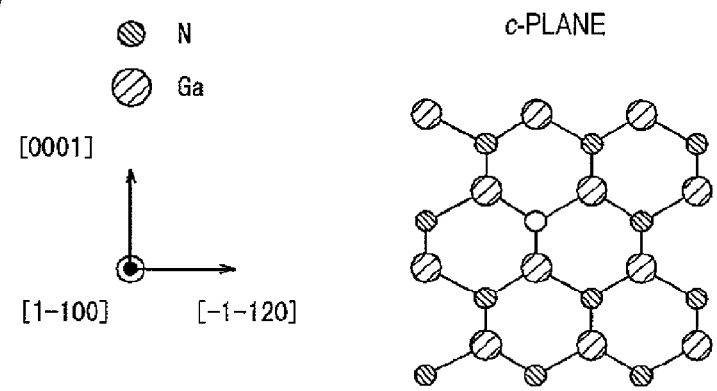
FIG. 3C illustrates the crystal structure of a c-plane.

The crystal structure of a nitride-based semiconductor, of which the principal surface is a c-plane, as viewed on a cross section thereof that intersects with the principal surface of the substrate at right angles is illustrated schematically in FIG. 3C just for a reference. In this case, Ga atoms and nitrogen atoms are not present on the same atomic-plane, and therefore, spontaneous electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c-plane are slightly misaligned from each other in the c-axis direction, and therefore, electrical polarization will be produced in the c-axis direction.

Referring to FIG. 3A again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where a+b+c=1, a≥0, b≥0 and c≥0), and an $Al_dGa_eN$ layer (where d+e=1, d≥0 and e≥0) 26, which is located on the other side of the active layer 24 opposite to the m-plane 12. In this embodiment, the active layer 24 is an electron injection region of the nitride-based semiconductor light-emitting device 100.

In this embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

The semiconductor multilayer structure 20 of this embodiment has other layers, one of which is an $Al_uGa_vIn_wN$ layer (where u+v+w=1, u≥0, v≥0 and w≥0) 22 that is arranged between the active layer 24 and the GaN-based substrate 10. The $Al_uGa_vIn_wN$ layer 22 of this embodiment has first conductivity type, which may be n-type, for example. Optionally, an undoped GaN layer could be inserted between the active layer 24 and the $Al_dGa_eN$ layer 26.

The thickness of the p-type $Al_dGa_eN$ layer 26 is, for example, 0.2 μm to 2 μm. In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction.

The $Al_dGa_eN$ layer 26 is doped with a dopant of the second conductivity type (p-type). Mg is commonly used as the p-type dopant. However, the $Al_dGa_eN$ layer 26 may be doped with, for example, Zn, Be, or the like.

From the viewpoint of reducing the contact resistance, the Al mole fraction may be zero (0) in the upper portion of the $Al_dGa_eN$ layer 26 (a portion of the $Al_dGa_eN$ layer 26 which is in contact with the electrode 30). In this case, the $Al_dGa_eN$ layer 26 may be realized by forming, for example, a 70 nm thick p-$Al_{0.14}Ga_{0.86}N$ layer 26A and a 0.5 μm thick p-type GaN layer 26B as shown in FIG. 3A. The p-type GaN layer 26B may contain a p-type impurity at a higher concentration than in the other part of the $Al_dGa_eN$ layer 26 (i.e., the p-$Al_{0.14}Ga_{0.86}N$ layer 26A).

In the upper portion of the $Al_dGa_eN$ layer 26 (a portion of the $Al_dGa_eN$ layer 26 which is in contact with the electrode 30), the Al mole fraction d may not be zero. For example, $Al_{0.05}Ga_{0.95}N$, in which the Al mole fraction is approximately 0.05, may be used.

On the principal surface side of the $Al_dGa_eN$ layer 26, there is a surface reforming layer 27. The surface reforming layer 27 is part of the $Al_dGa_eN$ layer 26 and does not need to have a multilayer structure which has a clear boundary. The surface reforming layer 27 has a larger number of Ga vacancies than the other part of the $Al_dGa_eN$ layer 26. Therefore, the amount of an active dopant which is substituted for the sites of Ga increases. Thus, the surface reforming layer 27 has such characteristics that the carrier concentration is high and the resistance is low.

The thickness of the surface reforming layer 27 is not particularly limited but may be not less than 5 nm and not more than 50 nm.

In the example of FIG. 3A, the surface reforming layer 27 is provided in the upper portion of the GaN layer 26B. The positional relationship between the GaN layer 26B and the surface reforming layer 27 is not limited to what is shown in FIG. 3A. Specifically, the surface reforming layer 27 may extend to a deeper region than the GaN layer 26B does. Alternatively, the thickness of the surface reforming layer 27 may be generally equal to that of the GaN layer 26B.

The electrode 30 is in contact with the surface reforming layer 27 and functions as p-type electrode (p-side electrode).

In the present embodiment, a portion of the electrode 30 which is in contact with the surface reforming layer 27 is made of Ag or an Ag alloy. To efficiently extract light from the light-emitting device 100, it is desired that Ag or an Ag alloy, which has low light absorbance, i.e., which has high reflectance for light, should be selected as the material of the electrode 30 as in the present embodiment. For example, when compared in terms of the reflectance for blue light, Ag reflects about 97%, Pt reflects about 55%, and Au reflects about 40%. Here, the Ag alloy refers to, for example, an alloy which contains Ag as a base material and one or more different metal additives of a very small amount (for example, Mg, Ni, Cu, Zn, Ga, Pd, In, Sn, Nd, Sm, Pt, Au, Bi, etc.). The Ag alloy can have improved oxidation resistance or sulfuration resistance according to the type of the added metal as compared with pure Ag, so that deterioration in reflectance can be prevented.

The electrode 30 may be a single layer which is made of Ag or an Ag alloy. Alternatively, the electrode 30 may have a multilayer structure, which is constituted of a layer that is made of Ag or an Ag alloy and a metal layer that is made of a metal other than Ag. Note that, of the electrode 30, the Ag or Ag alloy layer may be provided so as to be in contact with the surface reforming layer 27.

As the metal used in the second and subsequent layers of the electrode 30, a metal which would not be diffused in the Ag layer to form a low light reflectance alloy, or a metal which would not be diffused in the semiconductor multilayer structure 20 to deteriorate the contact resistance, may be selected. Specifically, as the metal that may be used in the second and subsequent layers of the electrode 30, a metal which is unlikely to be mixed with the Ag layer, such as Fe and W, or a metal which is unlikely to be diffused in $Al_xGa_yIn_zN$ (x+y+z=1, x≥0, y≥0, z≥0) or which would not cancel the effects of the dopant even if diffused therein, such as Pd, Pt, Ni, and Mo, is selected.

If the layer thickness of the electrode 30 is excessively small, aggregation will be caused by a heat treatment which will be described later, so that the electrode 30 can have the form of islands. If the layer thickness of the electrode 30 is excessively large, strain will be caused so that it can readily peel off. For these reasons, the thickness of the electrode 30 of the present embodiment may be in the range of not less than 20 nm and not more than 500 nm, for example.

In the present embodiment, the Ag or Ag alloy layer is provided so as to be in contact with the surface reforming layer 27. Therefore, at the interface in which the GaN-based semiconductor and the metal electrode are in contact with each other, absorption of light by the metal can be prevented. Thus, a nitride-based semiconductor light-emitting device with high light extraction efficiency is obtained. Japanese Patent Application No. 2009-091506 (hereinafter, referred to as "prior application") discloses that the contact resistance and the light absorption loss are reduced by providing an electrode structure which is made of Mg—Ag on a p-type GaN layer which has an m-plane principal surface. In the prior application, a Mg layer is in contact with the p-type GaN layer, and light from an active layer is absorbed by this Mg layer. On the other hand, in the present embodiment, a Ag layer with high reflectance is in contact with the surface reforming layer 27. Therefore, the light absorption loss can be considerably reduced as compared with the prior application.

Figure 3D:
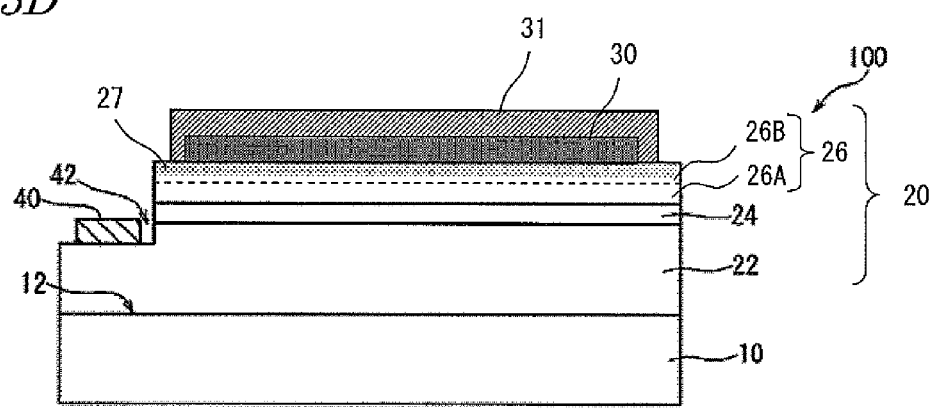
FIG. 3D is a schematic cross-sectional view of the nitride-based semiconductor light-emitting device 100 of the first embodiment.
Figure 3E:
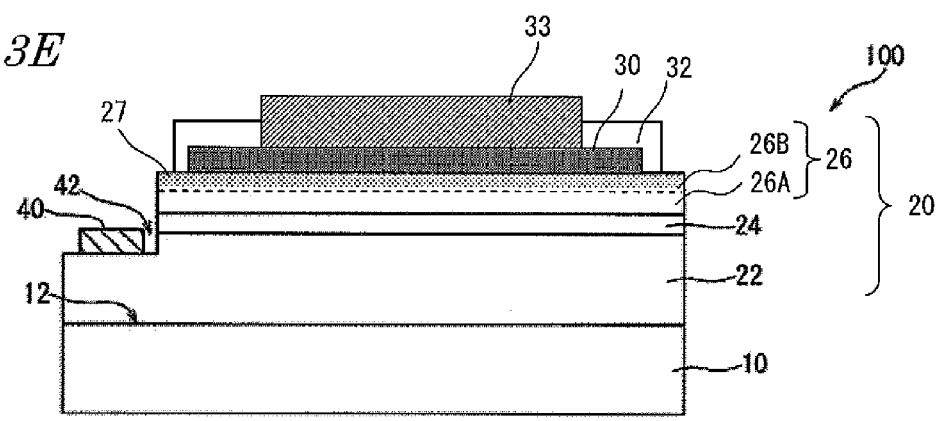
FIG. 3E is a schematic cross-sectional view of the nitride-based semiconductor light-emitting device 100 of the first embodiment.

To prevent deterioration of the electrode 30 in an environment where the semiconductor device is supposed to operate, the electrode 30 is desirably covered with a material which is unlikely to cause a reaction with the electrode 30. For example, as shown in FIG. 3D, the electrode 30 may be covered with a metal layer 31. Alternatively, as shown in FIG. 3E, an interconnect layer 33 may be provided on the upper surface of the electrode 30, with the perimeter portion of the electrode 30 (a portion of the surface of the electrode 30 which is not covered with the interconnect layer 33) being covered with a dielectric layer 32. The metal layer 31 and the interconnect layer 33 are desirably realized by a metal layer or an alloy layer which is made of Fe or W and Pd, Pt, Ni, or Mo as described above, but may be realized by an electrode layer or an interconnect layer which is made of a metal or alloy other than these metals. The dielectric layer 32 may be made of $SiO_x$, SiN, or the like.

The GaN-based substrate 10 that has the m-plane principal surface 12 may have a thickness of 100 μm to 400 μm, for example. This is because if the substrate has a thickness of approximately 100 μm or greater, then there will be no trouble handling such a wafer. It should be noted that as long as the GaN-based substrate 10 of this embodiment has an m-plane principal surface 12 made of a GaN-based material, the GaN-based substrate 10 could have a multilayer structure. That is to say, the GaN-based substrate 10 of this embodiment could also refer to a substrate, at least the principal surface 12 of which is an m-plane. That is why the entire substrate could be made of a GaN-based material. Or the substrate may also be made of the GaN-based material and another material in any combination.

In the structure of this embodiment, an electrode 40 has been formed as an n-side electrode on a portion of an n-type $Al_uGa_vIn_wN$ layer 22 (with a thickness of 0.2 μm to 2 μm, for example) above the GaN-based substrate 10. In the example illustrated in FIG. 3A, in the region of the semiconductor multilayer structure 20 where the electrode 40 is arranged, a recess 42 has been cut so as to expose a portion of the n-type $Al_uGa_vIn_wN$ layer 22. And the electrode has been formed on the exposed surface of the n-type $Al_uGa_vIn_wN$ layer 22 at the bottom of the recess 42. The electrode 40 may have a multilayer structure consisting of Ti, Al and Pt layers and may have a thickness of 100 nm to 200 nm, for example.

Hereinafter, it will be described with reference to FIG. 3 and FIG. 4 once again how to fabricate the nitride-based semiconductor light-emitting device 100 of this embodiment.

First of all, an m-plane GaN-based substrate 10 is prepared. In this embodiment, a GaN substrate is used as the GaN-based substrate 10. The GaN substrate of this embodiment is obtained by HVPE (hydride vapor phase epitaxy).

For example, a thick GaN film is grown to a thickness of several nanometers on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The GaN-based substrate 10 used may be a GaN substrate. Other examples of the GaN-based substrate 10 include a gallium oxide substrate, a SiC substrate, a Si substrate and a sapphire substrate, for example. To grow an m-plane GaN-based semiconductor on the substrate by epitaxy, the principal surface of the SiC or sapphire substrate may be also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this embodiment, crystal layers are formed one after another on the GaN-based substrate 10 by MOCVD (metalorganic chemical vapor deposition) process.

Next, an $Al_uGa_vIn_wN$ layer 22 is formed on the m-plane GaN-based substrate 10. As the $Al_uGa_vIn_wN$ layer 22, AlGaN may be deposited to a thickness of 3 μm, for example. A GaN layer may be deposited by supplying TMG($Ga(CH_3)_3$), TMA ($Al(CH_3)_3$) and $NH_3$ gases onto the m-plane GaN-based substrate 10 at 1100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature may be lowered to 800° C. to introduce In.

Thereafter, an undoped GaN layer is deposited to a thickness of 30 nm, for example, on the active layer 24, and then an $Al_dGa_eN$ layer 26 is formed on the undoped GaN layer. Here, as the $Al_dGa_eN$ layer 26, for example, a 70 nm thick p-$Al_{0.14}Ga_{0.86}N$ layer 26A and a 0.5 μm thick p-type GaN layer 26B are formed. In this case, to form the p-$Al_{0.14}Ga_{0.86}N$ layer 26A in the first place, TMG, $NH_3$, TMA, TMI gases and $Cp_2Mg$ (cyclopentadienyl magnesium) gas as a p-type dopant source are supplied.

Then, in order to form the p-type GaN layer 26B, supply of TMA that is the source gas of Al is stopped. Meanwhile, the amount of $Cp_2Mg$ that is the source of the p-type impurity is increased. In this way, the p-type GaN layer 26B can be formed on the p-$Al_{0.14}Ga_{0.86}N$ layer 26A.

Next, the step for decreasing the contact resistance between the $Al_dGa_eN$ layer 26 and the p-type electrode 30 is described with reference to FIGS. 4A to 4C.

Firstly, a metal layer 28 with a thickness of 10 nm, for example, is deposited on the p-type GaN layer 26B of the $Al_dGa_eN$ layer 26 by a vacuum evaporation method (a resistance heating method, an electron beam method, or the like).

The metal layer 28 contains at least one of Mg and Zn. The metal layer 28 may be a single element layer of Mg or a single element layer of Zn or may be an alloy layer which is made of Mg and Zn. Note that the metal layer 28 may contain a metal or metals other than Mg and Zn as an impurity or impurities so long as the effects of the present embodiment are obtained.

The thickness of the metal layer 28 may be not less than 5 nm and not more than 500 nm, for example. If the thickness of the metal layer 28 is less than 5 nm, it will be difficult to uniformly form a film. If the thickness of the metal layer 28 is greater than 500 nm, peeling off of the metal layer 28 may occur due to stress strain.

The metal layer 28 does not need to have a compositional distribution which is uniform along the thickness direction. The metal layer 28 may have a multilayer structure, such as Mg/Zn, for example.

When the metal layer 28 includes a Mg layer, formation of the Mg layer may employ a technique for causing deposition of the material metal (Mg) while evaporating the material metal (Mg) in pulses (pulse evaporation method). This is because the Mg layer that is formed by the pulse evaporation method is dense and uniform and also provides the effect of preventing diffusion of Pt in the semiconductor layer during a heat treatment. When the metal layer 28 is made of an alloy of Mg and Zn, the Zn layer is formed after the Mg layer has been formed (or the Mg layer is formed after the Zn layer has been formed), and thereafter, a heat treatment may be performed on the metal layer 28 so that alloying of the Mg layer and the Zn layer can be advanced. Alternatively, the metal layer 28 may be formed by performing an evaporation using a mixture or compound of Mg and Zn as a source material and thereafter performing a heat treatment on the deposited material.

The upper surface of the metal layer 28 (the layer that contains at least one of Mg and Zn), which is on the opposite side to the $Al_dGa_eN$ layer 26, may be covered with another metal layer. The metal layer which covers the layer that contains at least one of Mg and Zn may be made of Pd, Pt, Ni, Mo, or Ag, for example. The layer thickness and the multilayer structure of the metal layer need to be determined such that the metal is not diffused to the semiconductor layer side to form a high resistance layer.

Figure 4A:
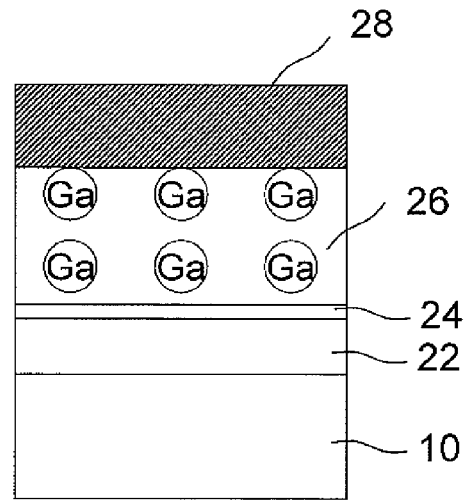
FIGS. 4A to 4C respectively show the step of forming a metal layer on a p-type semiconductor layer, the step of performing a heat treatment at an optimum temperature, and the step of removing the metal layer, which are included in the fabrication process of the nitride-based semiconductor light-emitting device 100 of the first embodiment.
Figure 4B:
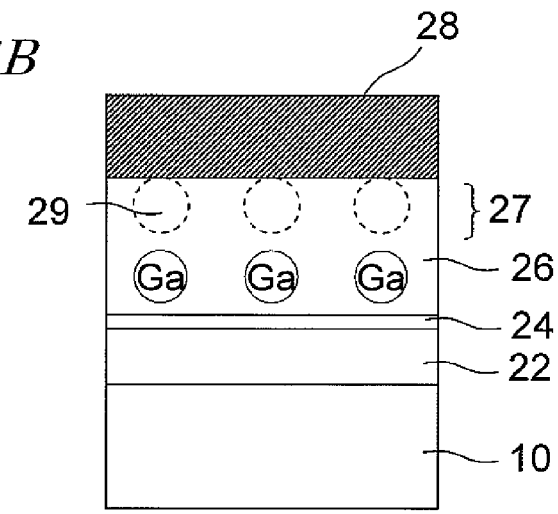

Thereafter, a heat treatment is performed at 600° C. for 10 minutes in, for example, an inert atmosphere, such as a nitrogen atmosphere, as shown in FIG. 4B. When the heat treatment is performed with the metal layer 28 having been formed on the p-type GaN layer 26B, Ga moves from the p-type GaN layer 26B to the metal layer 28 so that Ga vacancies are formed in the $Al_dGa_eN$ layer 26. As a result, the surface reforming layer 27 that has the Ga vacancies is formed. The mechanism of formation of the Ga vacancies will be discussed later.

Now, consider a case where a Mg layer is formed as the metal layer 28. If the temperature of the heat treatment that is performed with the metal layer 28 having been formed is not less than 500° C., diffusion of Ga sufficiently advances. It is inferred that, at the temperature of 600° C., diffusion of Ga further advances. If the temperature exceeds 700° C. and reaches a predetermined temperature (e.g., 800° C.) or a higher temperature, the film quality of the electrode and the GaN layer further deteriorates. Thus, the upper limit of the heat treatment temperature is preferably not more than 800° C. Also, more preferably, the heat treatment temperature is within the range of not less than 550° C. and not more than 700° C. In addition, a temperature near 600° C. (e.g., 600° C.±50° C.) is a more preferred heat treatment temperature (PCT/JP2009/002532).

Now, consider a case where a Zn layer is formed as the metal layer 28. If the temperature of the heat treatment that is performed with the metal layer 28 having been formed is not less than 400° C., diffusion of Ga sufficiently advances. If the heat treatment temperature exceeds 700° C. and reaches a predetermined temperature (e.g., 800° C.) or a higher temperature, the film quality of the electrode and the GaN layer further deteriorates. Thus, the upper limit of the heat treatment temperature is preferably not more than 700° C. More preferably, the heat treatment temperature is within the range of not less than 400° C. and not more than 650° C. In addition, a temperature which is not less than 450° C. and not more than 600° C. is a more preferred heat treatment temperature (PCT/JP2010/001921).

Now, consider a case where an alloy layer of Mg and Zn is formed as the metal layer 28. If the temperature of the heat treatment that is performed with the metal layer 28 having been formed is not less than 400° C., diffusion of Ga sufficiently advances. If the heat treatment temperature exceeds 700° C. and reaches a predetermined temperature (e.g., 800° C.) or a higher temperature, the film quality of the electrode and the GaN layer further deteriorates. Thus, the upper limit of the heat treatment temperature is preferably not more than 700° C. In addition, a temperature near 600° C. (e.g., 6000° C.±50° C.) is a more preferred heat treatment temperature (Japanese Patent Application No. 2010-008376).

Mg is a metal which is likely to undergo oxidation. Therefore, when the heat treatment is performed in an oxygen atmosphere, for example, there is a probability of oxidation of Mg. Thus, the atmosphere in which the heat treatment is performed is preferably an inert atmosphere, such as nitrogen.

Figure 4C:
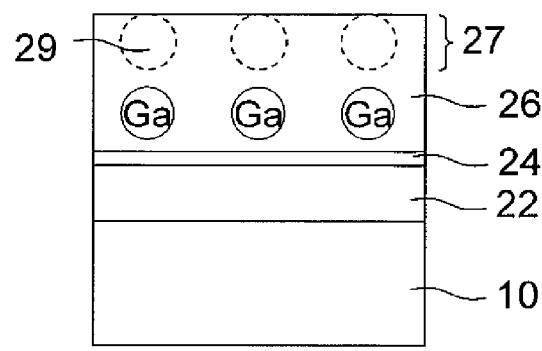

Then, the metal layer 28 is removed by etching, or the like, as shown in FIG. 4C. Here, the metal layer 28 contains Ga atoms diffused from the surface reforming layer 27. The metal layer 28 is removed by wet etching, which is realized by immersion in a nitric acid aqueous solution that is diluted to 10%, for example. When the upper surface of the metal layer 28 is covered with a film of a metal which has a low ionization tendency, such as Pt, this film and the metal layer 28 may be removed together by dry etching. In this case also, the dry etching is performed under such a condition that the surface reforming layer 27 is not damaged. For example, only the upper part of the metal layer 28 may be removed by dry etching while the Mg or Zn layer in the lower part of the metal layer 28 is removed by wet etching.

It is not necessary to entirely remove the metal layer 28. Part of the metal layer 28 may remain unremoved. However, to avoid absorption of light by the remaining part so that the light reflectance decreases, the thickness of the remaining part of the metal layer 28 after the etching step may be not more than 1 nm.

When a passive state occurs due to a reaction of an etching solution that is used in the wet etching step and the metal layer 28, the series resistance of the semiconductor device becomes high. Therefore, etching conditions which are unlikely to create a passive state need to be selected. Specifically, for example, when a Mg layer is formed as the metal layer 28, hydrofluoric acid, ammonium solution, or the like may be used as the etching solution. When a Zn layer is formed as the metal layer 28, nitric acid, or the like may be used as the etching solution. When both Mg and Zn are used, etching solutions for both of these elements may be used.

After the etching step has been done, the metal layer 28 which is not in the form of a film but in the form of islands or in the form of a porous layer may remain.

The surface reforming layer 27 is p-type GaN which has Ga vacancies. The surface reforming layer 27 sometimes contains residues of part of the metal layer 28.

Thereafter, the surface of the surface reforming layer 27 is covered with SiO$_2$, and a resist pattern is formed. The Al$_d$Ga$_e$N layer 26 including the surface reforming layer 27 and part of the undoped GaN layer and the active layer 24 are removed by chlorine dry etching. As a result, a recess 42 is formed so that a n-type electrode formation region of the Al$_x$Ga$_y$In$_w$N layer 22 is exposed. Then, on the n-type electrode formation region that is at the bottom of the recess 42, Ti/Al/Pt layers are formed as the n-type electrode 40.

Further, on the surface reforming layer 27, metal layers are formed in order of Ag and Pt using a vacuum evaporation method (a resistance heating method, an electron beam method, or the like). Subsequently, a heat treatment is performed at 600° C. in a nitrogen atmosphere.

Optionally, the GaN-based substrate 10 and a portion of the Al$_u$Ga$_v$In$_w$N layer 22 could be removed after that by some technique such as laser lift-off, etching or polishing. In that case, either only the GaN-based substrate or the GaN-based substrate 10 and a portion of the Al$_u$Ga$_v$In$_w$N layer 22 could be removed selectively. It is naturally possible to leave the GaN-based substrate 10 and the Al$_u$Ga$_v$In$_w$N layer 22 as they are without removing them. By performing these process steps, the nitride-based semiconductor light-emitting device 100 of this embodiment is completed.

In the nitride-based semiconductor light-emitting device 100 of this embodiment, when a voltage is applied to between the n- and p-type electrodes 40 and 30, holes are injected from the p-type electrode 30 into the active layer 24 and electrons are injected from the n-type electrode 40 into the active layer 24, thus producing photoluminescence with a wavelength of about 450 nm.

Note that Ag or an Ag alloy is likely to undergo migration and is also likely to undergo sulfuration due to the sulfuric (S) component in the ambient air. When it is used for an electrode of a semiconductor light-emitting device for practical use, an Ag layer or Ag alloy layer may be covered with a protector electrode which is made of a metal or metals different from Ag (e.g., Ti, Pt, Mo, Pd, Au, W). However, the light absorption loss of these metals is larger than that of Ag. Thus, the thickness of the Ag layer or Ag alloy layer is made equal to or greater than the penetration depth of light, i.e., 10 nm, so that all part of the light is reflected by the Ag layer or Ag alloy layer so as not to reach the protector electrode. In the case where a metal which causes a relatively small light absorption loss is used for the protector electrode, the protector electrode also has the effects of a reflection film. Therefore, the thickness of Ag may not be equal to or greater than 10 nm.

The film for protection of the Ag layer or Ag alloy layer may not be made of a metal. For example, a dielectric (such as SiO$_2$ and SiN) may be used. These have low refractive indices and provide higher reflectances.

Note that metal wires (Au, AuSn, or the like) for interconnection may be formed on the above-described metal protector electrode or dielectric protection film.

Next, the principle on which a p-type electrode of low contact resistance is obtained according to the present embodiment is described in detail using FIG. 5A to FIG. 5D. FIG. 5A to FIG. 5D are graphs which show the results of SIMS (Secondary Ion-microprobe Mass Spectrometer) analysis for Ga, N, Pt and Mg, respectively. The samples used in the measurements of FIG. 5A to FIG. 5D were prepared by stacking the metal layer 28 that included the Mg layer and the Pt layer that was covering the upper surface of the metal layer 28 and performing a heat treatment at 600° C. in a nitrogen atmosphere for 10 minutes. The measurements were carried out before removal of the metal layer 28. The Mg layer in the metal layer 28 was formed by a technique for causing deposition of the material metal (Mg) while evaporating the material metal (Mg) in pulses (pulse evaporation method).

$Cs^+$ was applied as the primary ion to a sample, and the mass of the sputtered secondary ion was measured to identify the elements that constitute the sample and obtain the profiles of the amount of the elements along the depth direction. In FIG. 5A to FIG. 5D, the horizontal axis represents the position (depth) in the sample. The position on the horizontal axis is a value which was calculated from the depth of a sputtering blemish after the SIMS measurement on the assumption that the sputtering rate was constant.

Figure 5A:
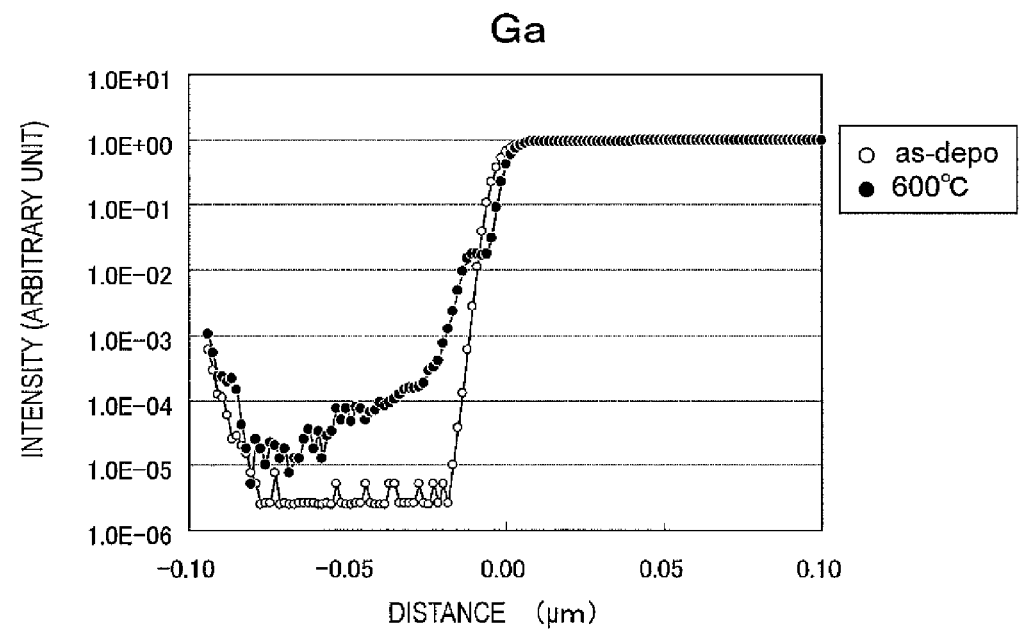
FIG. 5A is a graph of the profile of Ga in m-plane GaN/Mg/Pt along the depth direction by SIMS analysis.
Figure 5B:
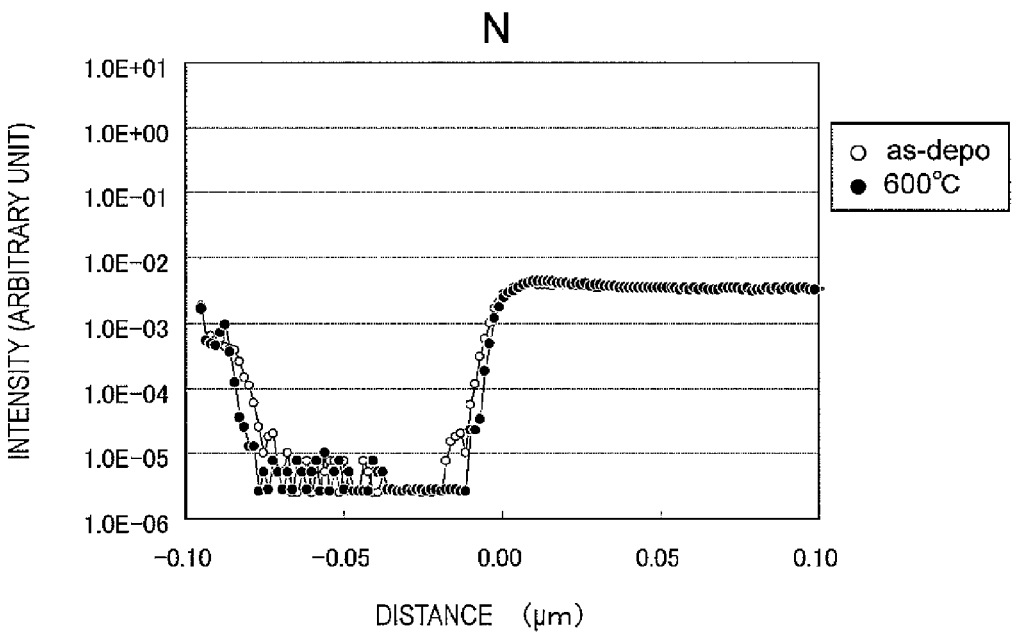
FIG. 5B is a graph of the profile of N in m-plane GaN/Mg/Pt along the depth direction by SIMS analysis.
Figure 5C:
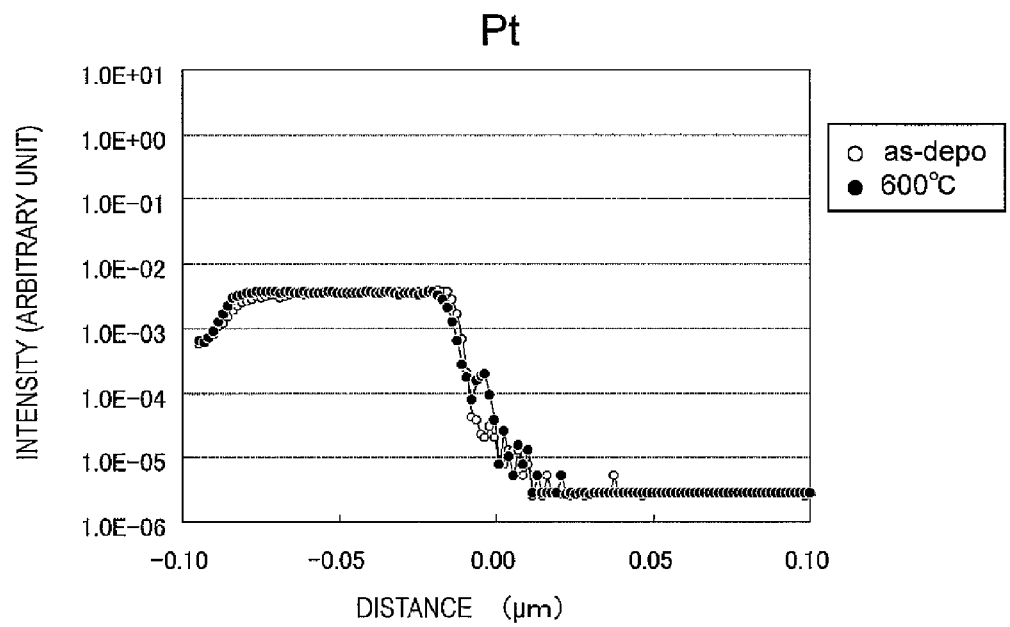
FIG. 5C is a graph of the profile of Pt in m-plane GaN/Mg/Pt along the depth direction by SIMS analysis.
Figure 5D:
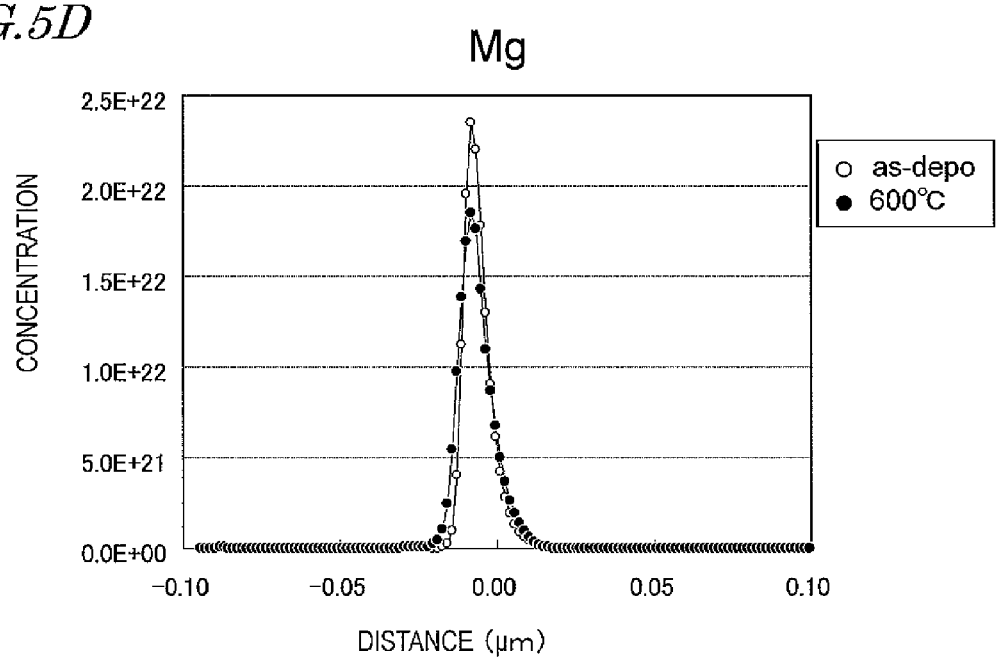
FIG. 5D is a graph of the profile of Mg in m-plane GaN/Mg/Pt along the depth direction by SIMS analysis.

The vertical axes of FIG. 5A, FIG. 5B, and FIG. 5C represent the detection intensity of Ga, N, and Pt, respectively, in arbitrary unit. For the sake of easy comparison between preheat treatment values and post-heat treatment values, the detection intensity values of Ga, N and Pt along the vertical axes of FIG. 5A, FIG. 5B and FIG. 5C were normalized with the maximum detection intensity of Ga being 1. The vertical axis of FIG. 5D represents values of the concentration of Mg which were converted from the detected intensity. Note that "1.0E+01" on the vertical axis means "$1 \times 10^1$", "1E-01" means "$1 \times 10^{-1}$", and "1E-02" means "$1 \times 10^{-2}$". That is, "1E+X" means "$1 \times 10^X$".

The position at which the intensity of Ga was reduced by half was defined as the interface between the metal layer 28 and the semiconductor where, at that position, the distance on the horizontal axes of FIG. 5A to FIG. 5D is zero (horizontal axis value=0.00).

Specifically, the minus side of the horizontal axis represents a position inside the metal layer 28, and the plus side represents a position inside the semiconductor layer. Before the heat treatment, the thickness of the Mg layer is 7 nm, and the thickness of the Pt layer is 75 nm. In FIG. 5A to FIG. 5D, open circles ○ represent the profile for the as-deposited state before the heat treatment, and solid circles ● represent the profile for a state after the heat treatment at 600° C.

As seen from FIG. 5A, in the as-deposited state, the Ga intensity in the metal layer 28 was at the background level, whereas after the heat treatment at 600° C., the Ga intensity increased by one order of magnitude. It is clearly understood from this result that Ga atoms are diffused from the semiconductor layer toward the metal layer 28 side by the heat treatment.

On the other hand, as seen from FIG. 5B, the profiles of N did not exhibit a substantial change after the heat treatment as compared with what was before the heat treatment. It is appreciated from this result that, in the present embodiment, the heat treatment is performed with the metal layer 28 having been stacked on the surface reforming layer 27, whereby only Ga atoms are diffused form the semiconductor multilayer structure side toward the metal layer 28 side, while nitrogen atoms are scarcely diffused. Since only Ga atoms are diffused toward the metal layer 28 side, the outermost surface of the surface reforming layer 27 is lacking Ga atoms, i.e., Ga vacancies are formed in the outermost surface (FIG. 4B).

When only Ga atoms are diffused toward the metal layer 28 side, the N concentration is higher than the Ga concentration in a portion of the p-type GaN near the interface with the metal layer 28. Specifically, it is inferred that, in a portion of the p-type GaN near the interface with the metal layer 28, the Ga vacancy concentration is higher than the N vacancy concentration. The Ga vacancies have acceptor-like properties, and therefore, as the Ga vacancy concentration at the interface between the metal layer 28 and the p-type GaN increases, holes more readily pass through the Schottky barrier of this interface by means of tunneling. On the other hand, when Ga atoms as well as N atoms are diffused toward the metal layer 28 side, the outermost surface of the surface reforming layer 27 is lacking N atoms, i.e., N vacancies are also formed. Since the N vacancies have donor-like properties, charge compensation occurs between the Ga vacancies and the N vacancies. Thus, it is estimated that the effect of reducing the contact resistance will not be obtained in this case.

It was also confirmed from the measurement results shown in FIG. 5C and FIG. 5D that Mg that was a constituent of the metal layer 28 and Pt that was covering the metal layer 28 were scarcely diffused toward the surface reforming layer 27 side.

The present inventor carried out a similar experiment with an electrode which was formed of Mg/Pt on a c-plane nitride-based semiconductor layer (see Japanese Patent Application No. 2009-536554). In this experiment, it was confirmed that not only Ga atoms but also N atoms were diffused toward the electrode side. It was also confirmed that Mg and Pt that were constituents of the electrode were diffused toward the nitride semiconductor layer side. Thus, the behaviors of the respective elements (Mg, Ga, N, Pt) are largely different between the c-plane and the m-plane.

It is estimated that each of the elements would behave in a similar manner even if part of Ga is replaced with Al or In in the GaN layer that is in contact with the electrode. It is also estimated that their behavior would be the same even if the GaN-based semiconductor layer that is in contact with the Mg layer is doped with a non-Mg element as a dopant. Further, it is also estimated that their behavior would be the same even if an alloy layer of Mg and Zn or a Zn layer is used as the metal layer 28 or even if the Zn layer is covered with a film of any other metal (a layer of a metal other than Mg and Zn).

Next, the features of the present embodiment are further described with reference to FIG. 6.

Figure 6A:
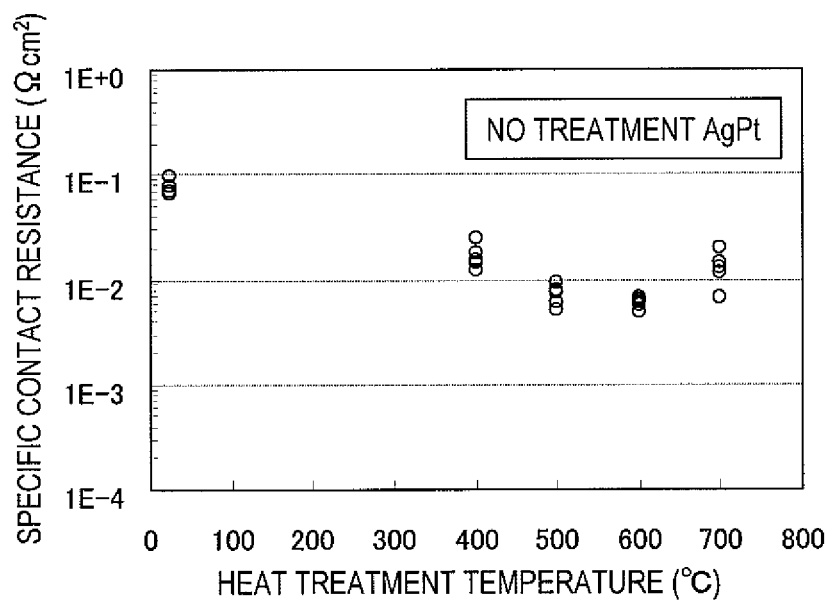
FIG. 6A is a graph illustrating the heat treatment temperature dependence of the specific contact resistance of an electrode which was realized by Ag/Pt layers which were formed on a p-type semiconductor layer (Comparative Example).
Figure 6B:
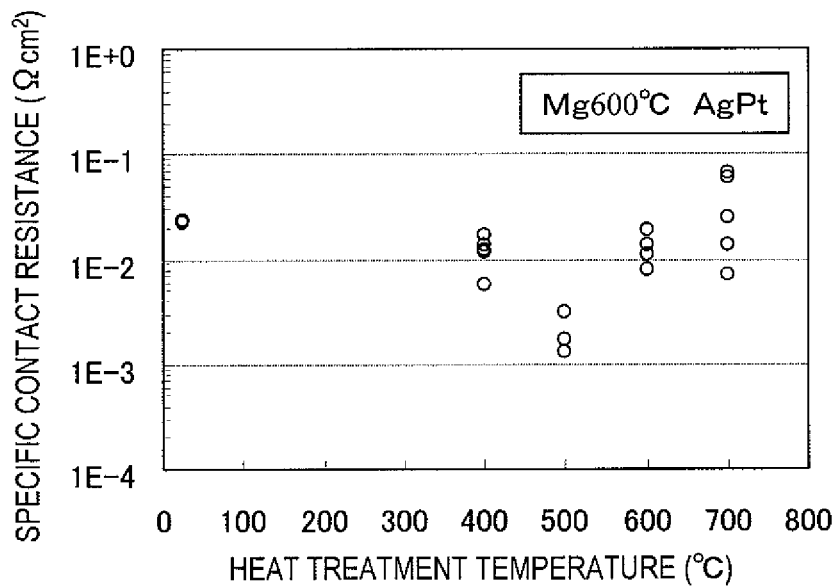
FIG. 6B is a graph illustrating the heat treatment temperature dependence of the specific contact resistance of an electrode which was realized by Ag/Pt layers which were formed after a heat treatment had been performed on a Mg layer formed on a p-type semiconductor layer and the Mg layer had been removed (Inventive Example).

FIG. 6A and FIG. 6B are graphs which show the results of measurement of the specific contact resistance Rc ($\Omega \cdot cm^2$). The specific contact resistance Rc is the result of evaluation of the current-voltage measurement between the electrode patterns shown in FIG. 6D according to TLM (Transmission Line Method).

Generally speaking, the contact resistance is inversely proportional to the area S ($cm^2$) of the contact. In this case, supposing $R(\Omega)$ is contact resistance, the equation R=Rc/S should be satisfied. The constant of proportionality Rc is called "specific contact resistance" and corresponds to contact resistance R when the contact area S is 1 $cm^2$. That is to say, the magnitude of the specific contact resistance does not depend on the contact area S and can be used as an index to evaluation of the characteristics of a contact. In the following description, the "specific contact resistance" will sometimes be referred to herein as just "contact resistance".

FIG. 6A shows the relationship between the specific contact resistance of a comparative example sample and the heat treatment temperature. The sample of FIG. 6A is an m-plane GaN (Ag/Pt) electrode which was realized by forming a Ag layer (100 nm) and a Pt layer (40 nm) in this order on a p-type m-plane GaN layer without performing a series of pretreatments such as illustrated in FIGS. 4A to 4C. The heat treatment temperature on the horizontal axis of FIG. 6A is the temperature of the heat treatment that was performed after formation of the Ag layer and the Pt layer.

As seen from FIG. 6A, the specific contact resistance of the sample which did not undergo a heat treatment, i.e., in the as-deposited state (the value which is shown at the position of about 20° C. on the horizontal axis in FIG. 6A) was $7.5 \times 10^{-2}$ ($\Omega \cdot cm^2$) on average. When the heat treatment was performed at 600° C., it decreased to $6.0 \times 10^{-3}$ ($\Omega \cdot cm^2$) on average. When the temperature was further increased to 700° C., the contact resistance increased. Therefore, the heat treatment temperature for the m-plane GaN (Ag/Pt) electrode is preferably not less than 400° C., for example. If the heat treatment temperature exceeds 700° C. and reaches a predetermined temperature (e.g., 800° C.) or a higher temperature, the film quality of the electrode and the GaN layer further deteriorates. Thus, the upper limit of the heat treatment temperature is preferably not more than 700° C. And, a temperature near 600° C. (e.g., 600° C.±50° C.) is a more preferred heat treatment temperature.

FIG. 6B shows the relationship between the specific contact resistance of the sample of the present embodiment and the heat treatment temperature. The sample of FIG. 6B was an m-plane GaN (Mg—Ag/Pt) electrode which was realized by depositing a Mg layer (7 nm) on a p-type m-plane GaN layer using a pulse evaporation method, performing a heat treatment at 600° C. in a nitrogen atmosphere for 10 minutes, removing the Mg layer by wet etching with the use of 10% nitric acid, and thereafter, forming a Ag layer (100 nm) and a Pt layer (40 nm) in this order. The heat treatment temperature on the horizontal axis of FIG. 6B is the temperature of the heat treatment that was performed after formation of the Ag layer and the Pt layer.

In the present embodiment, both the Mg layer on the m-plane and the Mg layer on the c-plane are deposited by a pulse evaporation method. On the other hand, metals other than Mg (Pt, Ag, etc.) are deposited by a commonly-employed electron beam deposition method.

As seen from FIG. 6B, the specific contact resistance of the m-plane GaN (Mg—Ag/Pt) electrode in the as-deposited state (the value which is shown at the position of about 20° C. on the horizontal axis in FIG. 6B) is $2.3 \times 10^{-2}$ ($\Omega \cdot cm^2$) on average, which is lower than the specific contact resistance of the m-plane GaN (Ag/Pt) electrode in the as-deposited state shown in FIG. 6A.

When the heat treatment temperature was 400° C. in the heat treatment performed on the m-plane GaN (Mg—Ag/Pt) electrode, the specific contact resistance decreased to $1.2 \times 10^{-2}$ ($\Omega \cdot cm^2$) on average. When the heat treatment temperature was 500° C., the specific contact resistance decreased to $2.0 \times 10^{-3}$ ($\Omega \cdot cm^2$) on average. In comparison to the case where the heat treatment temperature was 500° C., the specific contact resistance increased to $1.5 \times 10^{-2}$ ($\Omega \cdot cm^2$) on average when the heat treatment temperature was 600° C. When the heat treatment temperature was not less than 600° C., the value of the specific contact resistance increased as the temperature increased. Thus, the heat treatment temperature after formation of the electrode 30 is preferably not less than 400° C. and not more than 600° C. More preferably, it is around 500° C. (not less than 450° C. and not more than 550° C.). It is estimated that such a preferred range of the heat treatment temperature is the same even in the case where Zn is used in place of Mg, even in the case of a single element film of Ag, even in the case of an Ag alloy, and even in the case where a metal other than Pt is used in place of Pt formed on Ag.

Figure 6C:
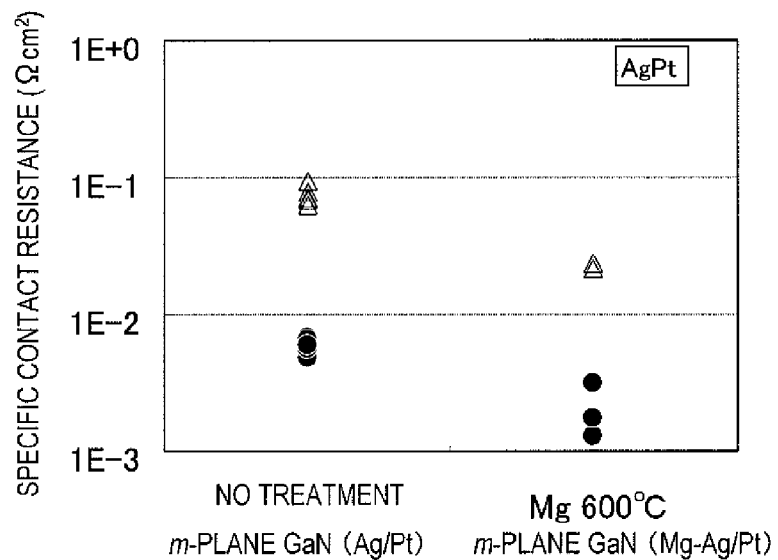
FIG. 6C is a graph illustrating the specific contact resistance of electrodes of Comparative Example and Inventive Example, including the electrodes which did not undergo a heat treatment and the electrodes which underwent a heat treatment at an optimum temperature.
Figure 6D:
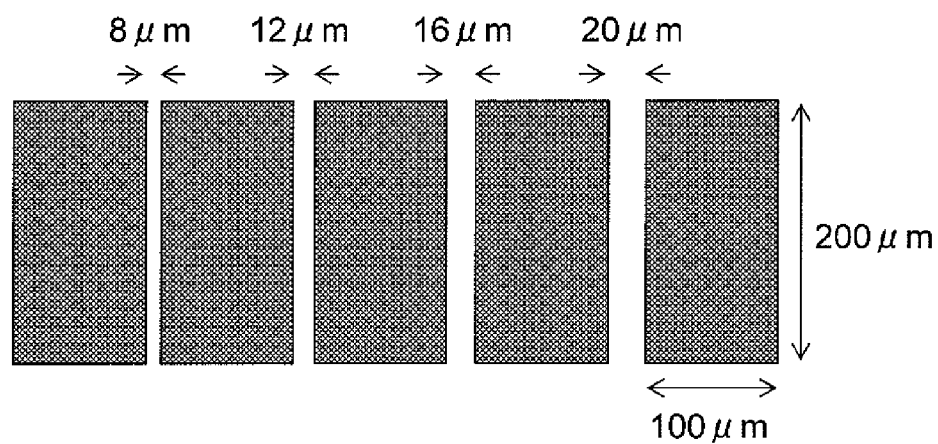
FIG. 6D is a TLM electrode pattern diagram.

FIG. 6C is a graph showing the specific contact resistance in the as-deposited state "Δ" and the contact resistance after the heat treatment at an optimum temperature "●" of the m-plane GaN (Ag/Pt) electrode (comparative example) and the m-plane GaN (Mg—Ag/Pt) electrode (present embodiment). As seen from FIG. 6C, in the as-deposited state (i.e., without a heat treatment), the sample of the present embodiment exhibited a lower specific contact resistance than the sample of the comparative example. The present embodiment is equivalent to the comparative example in that both have a Ag/Pt electrode. A difference of the present embodiment from the comparative example resides in a series of pretreatments where, before formation of a Ag/Pt electrode, a heat treatment is performed after a Mg layer has been formed on an m-plane GaN layer, and then, the Mg layer is removed. It is apparent from this result that, in the present embodiment, a series of pretreatments cause a change in the surface state of the m-plane GaN.

As seen from the measurement results of the present embodiment, the specific contact resistance of the m-plane GaN (Mg—Ag/Pt) electrode further decreased after the heat treatment as compared with a state where the Ag/Pt electrode is just formed (as-depo). It is appreciated from this result that performing the heat treatment after formation of the Ag/Pt electrode further improves the ohmic property of the principal surface of the m-plane GaN layer.

As described above, in the TLM measurement results shown in FIG. 6C, there is a clear difference in specific contact resistance. The reason why such results were obtained is probably that performing the heat treatment with the Mg layer having been deposited on the m-plane GaN layer caused Ga atoms in the m-plane GaN layer to move toward the Mg layer side so that Ga vacancies were formed. This can be explained from the above-described SIMS measurement results (the behavior of Ga illustrated in FIG. 5A).

Even though essentially different in configuration from the embodiment of the present invention, there is a related structure which is disclosed in Japanese Laid-Open Patent Publication No. 2005-197631 (hereinafter, referred to as Patent Document 1). However, Patent Document 1 does not mention at all that the crystallographic plane of the GaN-based semiconductor layer is an m-plane but just disclose a technique for forming an electrode on a c-plane GaN-based semiconductor layer. Patent Document 1 also discloses that not only the Ga element of the p-type GaN-based semiconductor layer creates a solid solution in the metal layer, but also at least one of the elements of the metal layer which is selected from the group consisting of Au, Mg, Mn, Mo, Pd, Pt, Sn, Ti and Zn is diffused to the p-type GaN-based semiconductor, whereby the elements are replaced by each other, so that the contact resistance decreases. However, according to this method, the element of the metal layer creates a deep intraband level in the semiconductor layer to cause charge compensation of Ga vacancies. Thus, the resistance reducing effect cannot be sufficiently achieved.

On the other hand, in the present embodiment, the elements of the metal layer (Mg) are not substantially diffused to the p-type GaN-based semiconductor layer as illustrated in FIG. 5D, but only the Ga elements of the p-type GaN-based semiconductor layer move toward the metal layer side as illustrated in FIG. 5A, so that vacancies are formed in the p-type GaN-based semiconductor layer. Thus, the present embodiment is quite different from Patent Document 1. The present inventor found that formation of Ga vacancies is significant for reduction of the contact resistance of the m-plane p-type GaN.

A mechanism which is significant in the embodiment of the present invention is that formation of Ga vacancies leads to formation of acceptors, and holes more readily pass through by means of tunneling, so that the contact resistance can be reduced. Therefore, achievement of the same effects is expected from other methods than the method of performing a heat treatment with a metal layer having been deposited such as in the embodiment of the present invention. For example, the method for forming Ga vacancies during epitaxial growth by modifying the crystal growth conditions for the outermost surface of the p-type GaN to appropriate conditions, specifically by reducing the V/III source gas supply ratio, for example, and the method for forming Ga vacancies by means of nitrogen ion irradiation, or the like, may be possible.

Figure 7A:
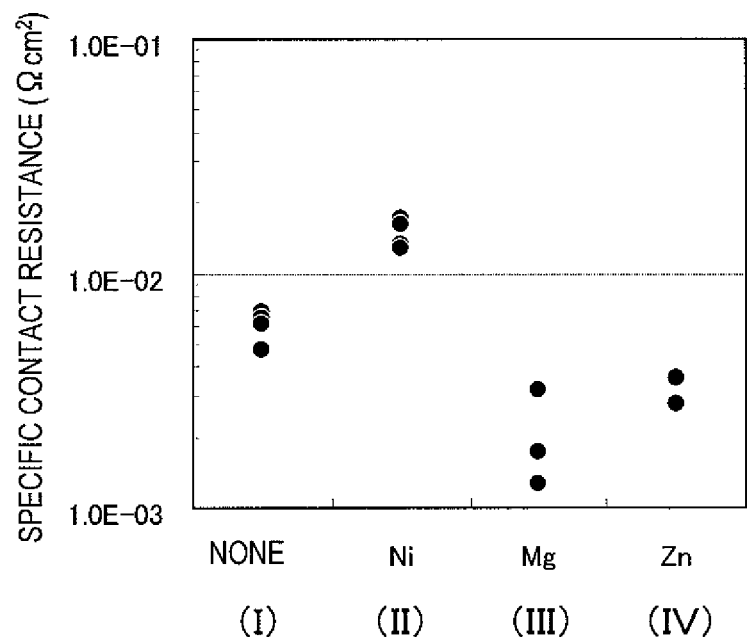
FIG. 7A is a graph showing the relationship between metals used in the metal layer 28 shown in FIG. 4A and the contact resistance.

FIG. 7A is a graph showing the relationship between metals used for the metal layer 28 shown in FIG. 4A and the contact resistance. Sample (I) is a sample which did not undergo a series of pretreatments where the metal layer 28 is formed, and a heat treatment is performed before the metal layer 28 is removed. Sample (II) is a sample on which the pretreatments were performed with a 20 nm thick nickel layer formed as the metal layer 28. Sample (III) is a sample on which the pretreatments were performed with a 7 nm thick Mg layer formed as the metal layer 28. Sample (IV) is a sample on which the pretreatments were performed with a 20 nm thick Zn layer formed as the metal layer 28. In each of samples (II) to (IV), the heat treatment in the pretreatments was carried out in a nitrogen atmosphere at 600° C. for 10 minutes. In each of samples (I) to (IV), a Ag (100 nm thick)/Pt (40 nm thick) electrode was formed as the p-type electrode 30, and thereafter, a heat treatment was carried out at an optimum temperature (600° C.) in a nitrogen atmosphere for 10 minutes. Note that samples (I) and (III) are the same as those used in the measurement illustrated in FIG. 6C. The specific contact resistances of samples (I) and (III) are the same as the results of FIG. 6C.

As seen from FIG. 7A, when nickel was used as the metal layer 28, the specific contact resistance exhibited a high value as compared with a case where the Mg layer and the Zn layer were used.

Figure 7B:
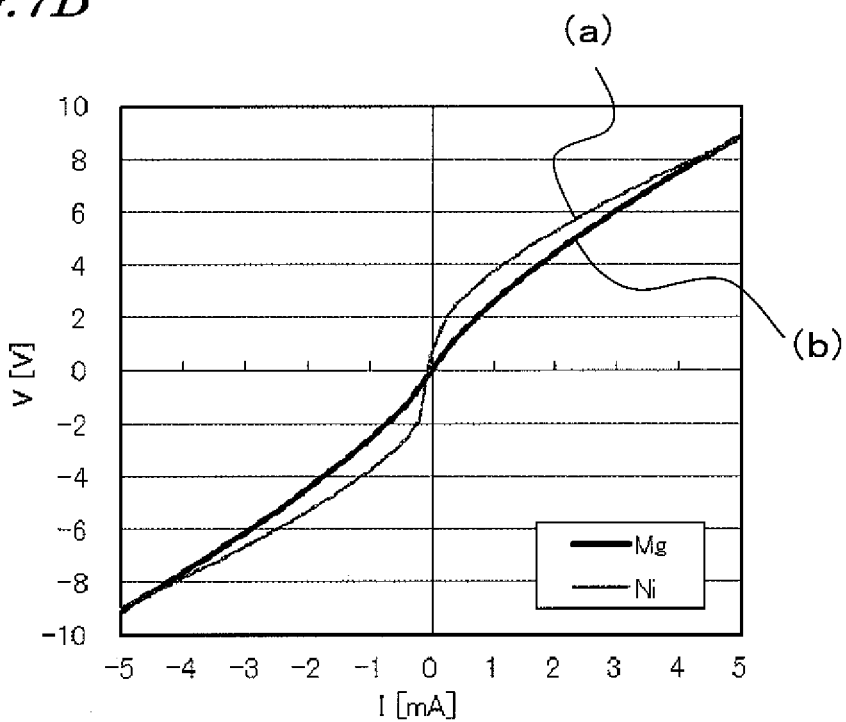
FIG. 7B is a graph showing the measurement results of the current-voltage characteristic.

FIG. 7B is a graph showing the measurement results of the current-voltage characteristic. Profile (a) of FIG. 7B was obtained when sample (II) of FIG. 7A was used. Profile (b) was obtained when sample (III) of FIG. 7A was used. In samples (II) and (III), the distance between electrodes (the distance shown in FIG. 6D) was 8 μm.

As seen from FIG. 7B, in the profile (a) for the case where nickel was used as the metal layer 28, the voltage is large in a low current region. It is appreciated from this result that the interface between the p-type GaN-based semiconductor layer and the p-type electrode was Schottky contact.

As seen from the results shown in FIGS. 7A and 7B, when a nickel layer is used as the metal layer 28 for the pretreatment, the contact resistance is high, and the Schottky property of the interface between the p-type GaN-based semiconductor layer and the p-type electrode is also high, as compared with a case where a Mg layer or a Zn layer is used. It is appreciated from this result that a metal which is used for the pretreatment in the embodiment of the invention of the present application is not arbitrary but is necessarily Mg or Zn.

Second Embodiment

Next, the second embodiment of the nitride-based semiconductor light-emitting device of the present invention is described.

Figure 8A:
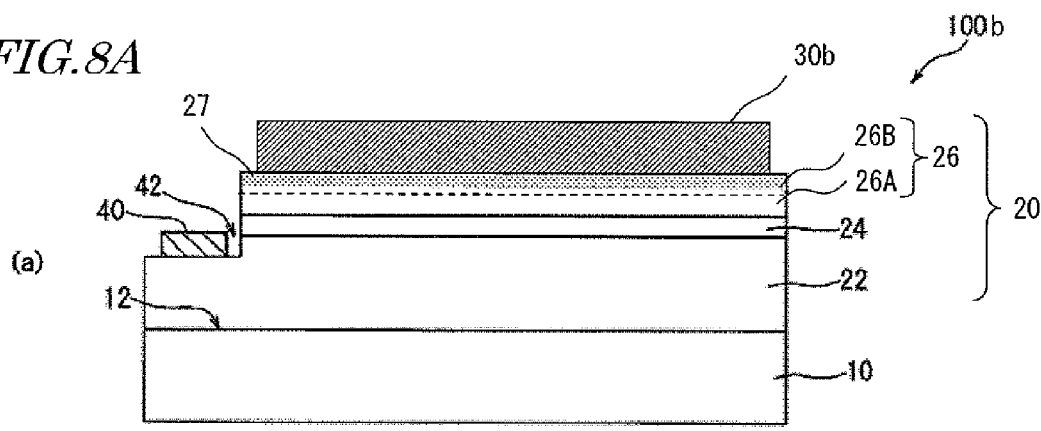
FIGS. 8A, 8B, and 8C are schematic cross-sectional views of a nitride-based semiconductor light-emitting device 100b of the second embodiment.
Figure 8B:
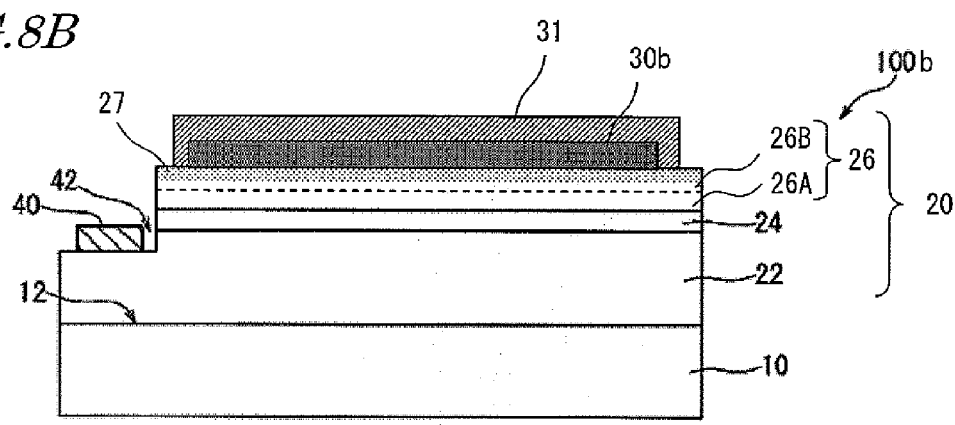
Figure 8C:
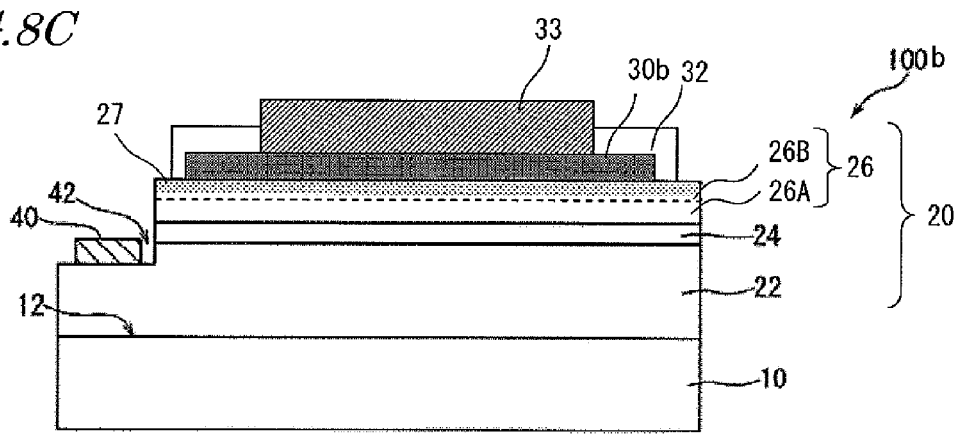

FIGS. 8A to 8C are cross-sectional views showing a nitride-based semiconductor light-emitting device 100b of the second embodiment. A major outstanding feature of the nitride-based semiconductor light-emitting device 100b of the present embodiment resides in that an electrode 30b is made of a metal other than Ag and an Ag alloy. The other aspects are the same as those of the nitride-based semiconductor light-emitting device 100, and therefore, the descriptions thereof are herein omitted. The electrode 30b may be made of any metal or any alloy other than Ag and an Ag alloy. For example, a metal such as Al, Ni, Pd, Pt, Ir, or the like, or an alloy thereof may be used. For example, when Al is used, the reflectance for blue light is high, specifically 92%, so that the light absorption loss can be reduced. Also, the electrode 30b does not need to be realized by a single layer but may be realized by a plurality of layers. Note that an electrode layer or an interconnect layer which is made of a metal or alloy other than these metals may be provided on the electrode 30b.

According to the present embodiment, as in the first embodiment, the step of performing the heat treatment with a metal layer which contains at least one of Mg or Zn having been formed on the surface reforming layer 27 and removing the metal layer by etching before formation of the electrode 30b.

In the compound-based semiconductor light-emitting device 100b having such a configuration, the surface reforming layer 27 has Ga vacancies which do not undergo charge compensation, and therefore, the contact resistance can be greatly reduced.

The light-emitting devices of the first and second embodiments may be used as a light source without any modification. However, if the light-emitting device of the first or second embodiment is combined with a resin including a phosphor that produces wavelength conversion, for example, the device can be used effectively as a light source with an expanded operating wavelength range (such as a white light source).

Figure 9:
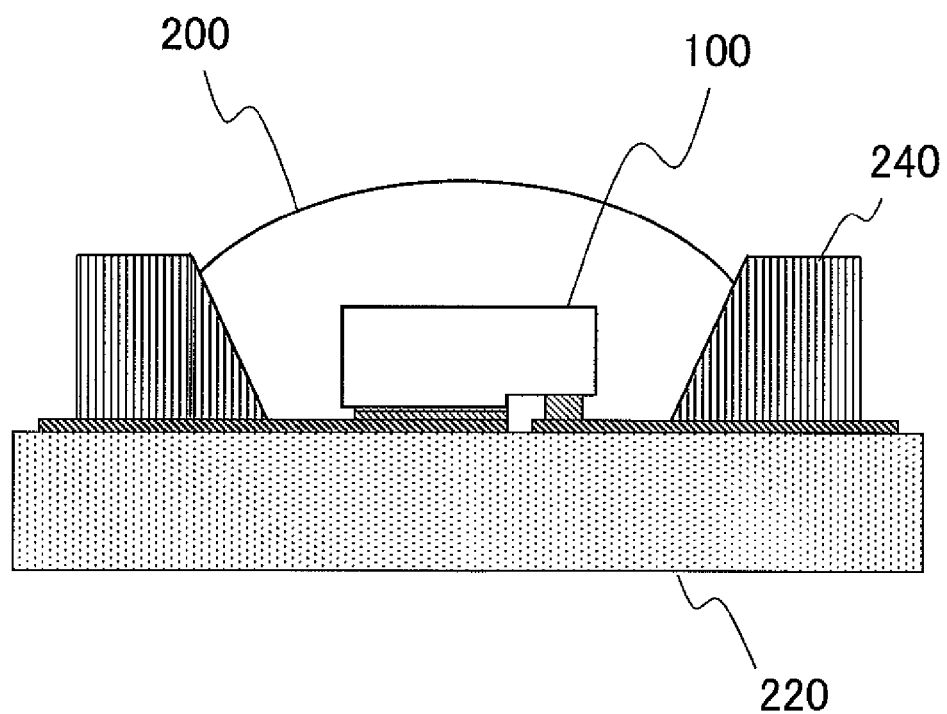
FIG. 9 is a cross-sectional view showing a white light source.

FIG. 9 is a schematic representation illustrating an example of such a white light source. The light source shown in FIG. 9 includes a light-emitting device 100 with the structure shown in FIG. 3A (or the light-emitting device 100b shown in FIG. 8) and a resin layer 200 in which particles of a phosphor such as YAG (yttrium aluminum garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

In the embodiments described above, the p-type $Al_aGa_eN$ layer (p-type semiconductor region) 26 that is in contact with the electrode 30 is supposed to be made of GaN or AlGaN. However, the p-type $Al_aGa_eN$ layer 26 may be a layer including In, such as an InGaN layer. In that case, the p-type semiconductor region that is in contact with the electrode 30 may be made of $In_{0.2}Ga_{0.8}N$ with an In mole fraction of 0.2, for example. If In is included in GaN, the bandgap of $Al_aGa_bN$ layer (where a+b=1, a≥0 and b≥0) can be smaller than that of GaN, and therefore, the contact resistance can be reduced as a result. Consequently, the p-type semiconductor region that is in contact with the electrode 30 may be made of an $Al_xIn_yGa_zN$ semiconductor (where x+y+z=1, x≥0, y≥0 and z≥0).

The effect of reducing the contact resistance can naturally be achieved by a non-LED light-emitting device (such as a semiconductor laser diode) or a device other than a light-emitting device (such as a transistor or a photodetector).

An actual m-plane does not need to be perfectly parallel to the m-plane but may be inclined from the m-plane by a predetermined angle. The angle of the inclination is defined by an angle formed by the normal to the actual principal surface of the nitride semiconductor layer and the normal to the m-plane (m-plane without inclination). The actual principal surface can be inclined from the m-plane (m-plane without inclination) in the direction of a vector which is represented by the c-axis direction and the a-axis direction. The absolute value of the inclination angle θ may be not more than 5°, preferably not more than 1°, in the c-axis direction. In the a-axis direction, the absolute value of the inclination angle θ may be not more than 5°, preferably not more than 1°. Specifically, in the embodiment of the present invention, the "m-plane" includes a plane which is inclined from the m-plane (m-plane without inclination) in a predetermined direction by an angle in the range of ±5°. Within such a range of the inclination angle, the principal surface of the nitride semiconductor layer, as a whole, is inclined from the m-plane. However, upon closer observation, a large number of m-plane regions are exposed over the principal surface. Thus, it is expected that a plane which is inclined from the m-plane by an angle of not more than 5° (absolute value) has the same characteristics as those of the m-plane. When the absolute value of the inclination angle θ is not greater than 5°, decrease of the internal quantum efficiency due to a piezoelectric field can be avoided.

According to the embodiments of the present invention, the contact resistance can be greatly reduced in a GaN-based semiconductor device which is formed by means of crystal growth on an m-plane substrate or in a GaN-based semiconductor multilayer structure which has an m-plane principal surface.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for fabricating a nitride-based semiconductor light-emitting device, comprising the steps of:

(a) preparing a substrate;
   (b) forming on the substrate a nitride-based semiconductor multilayer structure including a p-type semiconductor region, the p-type semiconductor region being made of an $Al_xIn_yGa_zN$ semiconductor (x+y+z=1, x≥0, y≥0, z≥0), and a principal surface of the p-type semiconductor region being an m-plane;
   (c) forming a metal layer which contains at least one of Mg and Zn on the principal surface of the p-type semiconductor region and performing a heat treatment;
   (d) removing the metal layer; and
   (e) forming a p-type electrode on the principal surface of the p-type semiconductor region,
   wherein the heat treatment of step (c) causes a N concentration in the p-type semiconductor region to be higher than a Ga concentration in the p-type semiconductor region, and
   the heat treatment of step (c) does not cause diffusion of Mg or Zn from the metal layer to the p-type semiconductor region.

2. The method of claim 1, wherein the heat treatment of step (c) causes a Ga vacancy concentration in the p-type semiconductor region to be higher than a N vacancy concentration in the p-type semiconductor region.

3. The method of claim 1, wherein the p-type electrode contains Ag or an Ag alloy.

4. The method of claim 1, wherein step (e) includes heating the metal layer at a temperature of not less than 400° C. and not more than 600° C.

5. The method of claim 1, wherein
   step (c) includes forming the metal layer which includes a Mg layer, and
   the Mg layer is formed by applying an electron beam in pulses to Mg such that Mg is evaporated and deposited on the p-type semiconductor region.

6. The method of claim 1, wherein
   when the metal layer is a Mg layer, the heat treatment in step (c) is performed at a temperature of not less than 550° C. and not more than 800° C., and
   when the metal layer is a Zn layer or an alloy layer of Mg and Zn, the heat treatment in step (c) is performed at a temperature of not less than 400° C. and not more than 700° C.

7. The method of claim 1, wherein the heat treatment in step (c) is performed in an inert gas atmosphere.

8. The method of claim 1, further comprising the step of removing the substrate after step (b).

* * * * *